(12) United States Patent
Church et al.

(10) Patent No.: US 10,059,056 B2
(45) Date of Patent: Aug. 28, 2018

(54) MICRO-DISPENSING MULTI-LAYERED 3D OBJECTS WITH CURING STEPS

(71) Applicant: nScrypt, Inc., Orlando, FL (US)

(72) Inventors: Kenneth H. Church, Orlando, FL (US); Charles M. Newton, Palm Bay, FL (US); Xudong Chen, Orlando, FL (US); Patrick A. Clark, Orlando, FL (US)

(73) Assignee: NSCRYPT, INC., Orlando, FL (US)

( * ) Notice: Subject to any disclaimer, the term of this patent is extended or adjusted under 35 U.S.C. 154(b) by 605 days.

(21) Appl. No.: 13/755,076

(22) Filed: Jan. 31, 2013

(65) Prior Publication Data

US 2013/0193619 A1 Aug. 1, 2013

Related U.S. Application Data

(60) Provisional application No. 61/593,656, filed on Feb. 1, 2012.

(51) Int. Cl.
| | |
|---|---|
| *B29C 64/106* | (2017.01) |
| *B29C 67/00* | (2017.01) |
| *B33Y 30/00* | (2015.01) |
| *B33Y 40/00* | (2015.01) |
| *H05K 3/12* | (2006.01) |

(52) U.S. Cl.
CPC ........ *B29C 67/0081* (2013.01); *B29C 64/106* (2017.08); *B33Y 30/00* (2014.12); *B33Y 40/00* (2014.12); *H05K 3/1241* (2013.01); *H05K 2203/0126* (2013.01); *Y10T 29/4913* (2015.01)

(58) Field of Classification Search
CPC .................. B29C 67/0059; B29C 67/008; H05K 3/1241; H05K 3/30
See application file for complete search history.

(56) References Cited

U.S. PATENT DOCUMENTS

| | | | | |
|---|---|---|---|---|
| 5,134,569 | A * | 7/1992 | Masters | 264/308 |
| 5,260,009 | A * | 11/1993 | Penn | 264/401 |
| 6,706,234 | B2 | 3/2004 | Huang | |
| 7,556,490 | B2 | 7/2009 | Wicker et al. | |
| 7,658,603 | B2 | 2/2010 | Medina et al. | |
| 7,959,847 | B2 | 6/2011 | Wicker et al. | |
| 2004/0151978 | A1 | 8/2004 | Huang | |
| 2004/0245663 | A1* | 12/2004 | MacDougald et al. | 264/16 |
| 2005/0154075 | A1 | 7/2005 | Siegel | |

(Continued)

FOREIGN PATENT DOCUMENTS

EP 0 106 564 A1 4/1984

OTHER PUBLICATIONS

Nscrypt, Inc., PCT/US2013/024016 filed Jan. 31, 2013, "Notification of Transmittal of the International Search Report and The Written Opinion of the International Searching Authority, or the Declaration" dated Apr. 5, 2013.

*Primary Examiner* — Alison L Hindenlang
(74) *Attorney, Agent, or Firm* — Goodhue, Coleman & Owens, P.C.

(57) ABSTRACT

A method of building a three dimensional (3D) structure includes micro-dispensing a layer comprising a material using a syringe-based micro-dispensing tool, curing the layer, and repeating the steps of micro-dispensing and curing a plurality of times in order to build the three-dimensional structure. The material may be loaded with nano to micron sized particles, tubes, or strings.

19 Claims, 3 Drawing Sheets

(56) References Cited

U.S. PATENT DOCUMENTS

| | | |
|---|---|---|
| 2005/0280184 A1 | 12/2005 | Sayers et al. |
| 2009/0057284 A1 | 3/2009 | Fukuda et al. |
| 2009/0215209 A1 | 8/2009 | Anc et al. |
| 2010/0127433 A1 | 5/2010 | Medina et al. |
| 2010/0171792 A1* | 7/2010 | Sidhu .................. B29C 67/0055 347/44 |
| 2011/0237002 A1 | 9/2011 | Church et al. |

* cited by examiner

MICRO-DISPENSING MULTI-LAYERED 3D OBJECTS WITH CURING STEPS

CROSS-REFERENCE TO RELATED APPLICATIONS

This application claims priority under 35 U.S.C. § 119 of a provisional application Ser. No. 61/593,656 filed Feb. 1, 2012, and which application is hereby incorporated by reference in its entirety.

FIELD OF THE INVENTION

The present invention relates to micro-dispensing three dimensional (3D) objects. More particularly, but not exclusively, the present invention relates to a syringe-based approach to depositing polymers in order to manufacture 3D objects.

BACKGROUND OF THE INVENTION

Screen printers, tensile screens and masks are some of the ways used to pattern a variety of aesthetic and circuit layouts. Screen printers require screens to pattern which can be costly and use excess material. Changing patterns can only be done by making unique screens for each pattern. There are significant materials that have been developed for screen printing, however, there is a range of material properties that works well for screen printing, but these must be tightly controlled for repeatable results. The advantage of these is the speed at which a pattern can be printed; screen printers are the industry standard for high speed or large volume. The disadvantage is the need for a flat surface and screen printing is limited to low aspect ratio features and cannot produce 3D builds.

There is a need for a method to produce patterns on flat or conformal surfaces and to add multiple layers on those surfaces for high speed patterning of single materials, high speed patterning of multiple materials and high speed layering for 3D builds. Adding layers is known as additive manufacturing and is an established industry with a number of additive techniques. Standard stereolithography uses a vat of polymer material and focuses a laser on the surface of the vat and polymerizing the polymer material via Ultra Violet (UV) curing process. One technique to allow for multiple materials is to use multiple vats, which is cumbersome. Additional techniques such as ink jetting a thin UV polymer does allow for multiple material additive building; the limitation to this approach is the limited material choices; ink jettable material must be a low viscous material with low to no particle loading. An extrusion method called Fused Deposition Modeling uses a heated nozzle and pushes a plastic or metal wire through to build 3D shapes. The limitation here is the requirement for heat to melt the plastic or metal wire before extrusion.

Therefore, despite various approaches available, problems remain.

SUMMARY OF THE INVENTION

Therefore, it is a primary object, feature, or advantage of the present invention to improve over the state of the art.

It is a further object, feature, or advantage of the present invention to provide a method that allows 3D objects to be manufactured using higher viscous materials which can be loaded with particles of varying size, nano to micron size particles, and including nano to micron sized tubes or strings.

It is a further object, feature, or advantage of the present invention to provide a method that allows for printing a layered pattern of any shape.

It is a still further object, feature, or advantage of the present invention to provide the ability to trim, clean, cut or ablate for material removal.

It is another object, feature, or advantage of the present invention to place packaged and unpackaged die.

It is a further object, feature, or advantage of the present invention to provide an additive approach to build 3D structures using micro-dispensing of materials and partially or fully cured after each layer of printing.

Another object, feature, or advantage of the present invention is to provide an additive approach to building 3D structures which allows for each layer to be cured in real-time so that there is no need to wait for an entire layer to be printed.

It is a still further object, feature, or advantage of the present invention to allow material to be cured that can be loaded with nano to micron sized particles, tubes or strings.

Another object, feature, or advantage of the present invention is to provide a curing to be photo, thermal, electrically, inductively or chemically induced.

Yet another object, feature, or advantage of the present invention is to allow partial or complete circuits to be printed on any or all layers.

A further object, feature, or advantage of the present invention is to allow packaged or unpackaged die to be placed on any or all layers.

A still further object, feature, or advantage of the present invention is to include multiple nozzles operating independently which may be used in parallel or in series to increase the speed of 3D building.

Another object, feature, or advantage of the present invention is to provide multiple nozzles with a range of materials in each providing a variety of material properties operating independently which may be used in parallel or in series to increase speed of circuit printing.

Yet another object, feature, or advantage of the present invention to allow for multiple laser or UV cure or other curing or cutting sources to be used in parallel or in series to increase the speed of 3D building.

A further object, feature, or advantage of the present invention is to allow for multiple lasers or splitting a laser to allow for parallel cutting to be used, thus increasing the speed of material removal.

A still further object, feature, or advantage of the present invention is to allow for feedback using cameras and vision to aid in automation will increase the speed and accuracy of 3D builds.

Another object, feature, or advantage of the present invention is to allow for cameras to be utilized in situ or in a serial manner for observation.

A further object, feature, or advantage of the present invention is to allow for sensors for heat to be utilized as feedback and including real time, allowing for temperature control over the curing or annealing process.

A still further object, feature, or advantage of the present invention is to allow for sensors for light to be utilized as feedback and including real time, allowing for photo sensitive curing control in the photo curing process.

One or more of these and/or other objects, features, and advantages of the present invention will become apparent from the specification and claims that follow. No single embodiment need meet or include every object, feature, or advantage as it is contemplated that different embodiments may have different objects, features, or advantages.

According to one aspect, a method of building a three dimensional (3D) structure is provided. The method includes micro-dispensing a layer comprising a material using a syringe-based micro-dispensing tool, curing the layer, and repeating the process a plurality of times to build the three-dimensional structure. The step of curing may occur in real-time. Various types of curing may be performed including photo curing, thermal curing, electrical curing, inductive curing, and chemically induced curing. During the process packaged or unpackaged dies may be placed on the layers. The material may be loaded with at least one of nano to micron sized particles, tubes, or strings and the method allows for post processing the three dimensional structure at a sufficiently high temperature to burn off the material and leave the particles.

According to another aspect, a method of building a three dimensional (3D) structure is provided. The method includes providing a system comprising: (a) a control system, (b) a syringe-based micro-dispensing tool operatively connected to the control system, the syringe-based micro-dispensing tool comprising a plurality of nozzles operating independently and the control system adapted to control the plurality of nozzles in parallel or in series, (c) a curing system for curing layers of the 3D structure. The method further provides for micro-dispensing a first layer comprising a first set of materials using the syringe-based micro-dispensing tool and curing the first layer using the curing system. The method further provides for micro-dispensing a second layer comprising a second set of materials using the syringe-based micro-dispensing tool, the second layer overlaying the first layer, curing the second layer using the curing system, and micro-dispensing and curing one or more additional layers, the additional layers overlaying the second layer. The first set of materials may include a plurality of materials and each of the plurality of nozzles may dispense a different material within the first set of materials. At least one of the materials within the first set of materials may be loaded with at least one of nano to micron sized particles, tubes, or strings.

DETAILED DESCRIPTION

Figure 1:
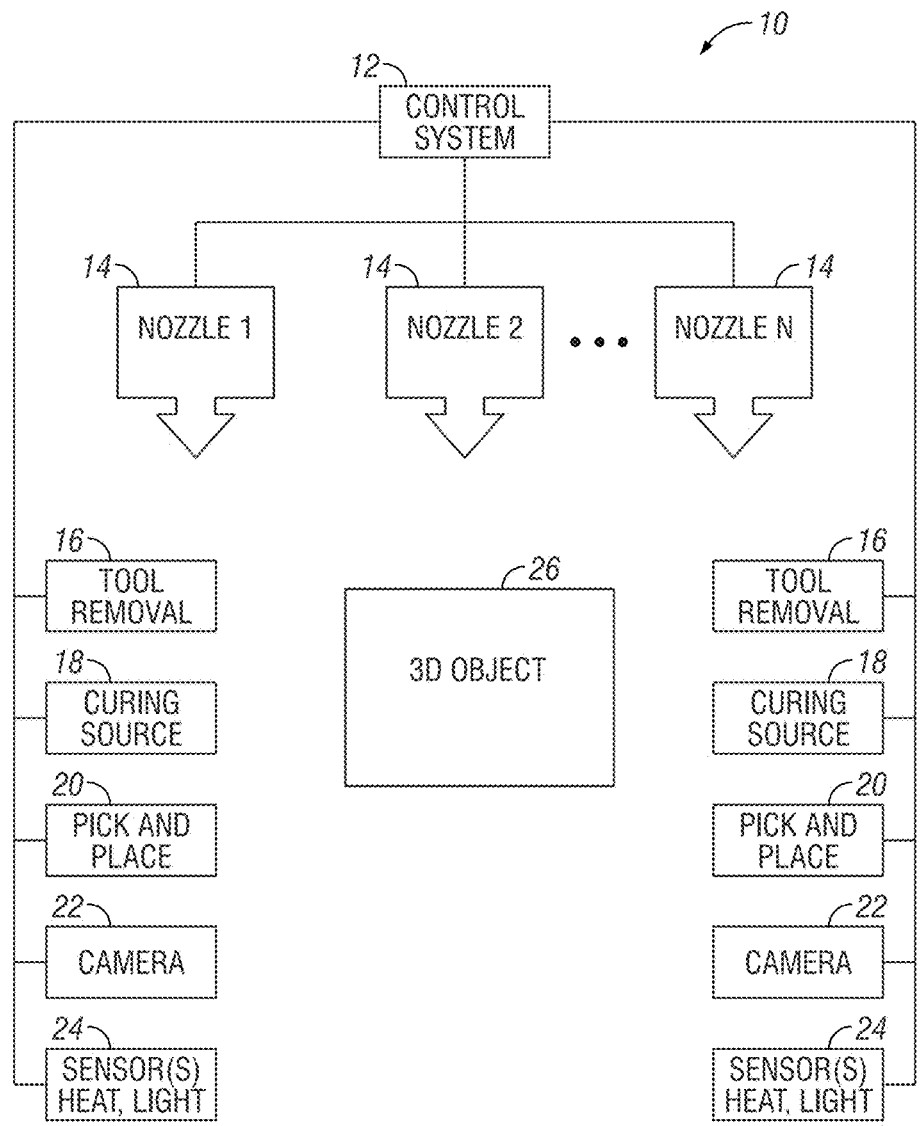
FIG. 1 illustrates one embodiment of a system.

To satisfy the higher viscous materials that can be loaded with particles of varying size, nano to micron size particles and including nano to micron sized tubes or strings, it is advantageous to utilize a micro-dispensing approach to print a layer of polymer and including loaded and not loaded with particles, tubes or strings and then curing the polymer layer via, chemical, heat or photo induced processes. In addition to having the ability to print a layered pattern of any shape, it is important to cure that layer before printing the next layer or adding other functional materials to that layer. Each layer added could be cured completely or partially thus allowing for structural integrity during the build. When the build is complete, a post cure of the entire structure may be optional.

In addition to having the ability to print a layered pattern of any shape, it is important to have the ability to trim, clean, cut or ablate for material removal. Material removal using a pulsed laser will allow for more precise 3D builds.

The layered pattern could be printed on a flat surface that will be removed or on an existing conformal surface that will become part of the final build. The layered pattern is not restricted in X, Y or Z dimension and each additional layer is not limited, therefore the structure can take on "any" 3D shape.

A number of nozzles can be placed on one platform, allowing for parallel printing of each layer, thus allowing for a significant increase in speed of building 3D objects. These nozzles can be placed in columns and rows allowing for a single pass or multiple passes to fabricate a pattern. Each nozzle can have the ability to turn material flow on or off thus allowing dots, dashes or lines to be printed. The combination of dots, dashes and lines can produce any 2D or conformal pattern. After curing or partial curing, a second layer of patterning and curing, and the process may be repeated until the final 3D build is complete.

After each layer, an additional layer of materials can be micro-dispensed which may include electrically functional materials. These electrically functional materials typically are conductors, resistors and dielectrics. In addition to these there are a number of piezo and semiconductor materials. Additional electrical materials are not limited and can have a variety of permeability and permittivity properties. The combination and proper placement of these materials produces electronic circuits and including resistors, capacitors, inductors, antennas, transistors, batteries and sensors. Advantages of this approach is in the gradient potential by simply changing materials in a juxtaposition fashion on a scale or resolution that will allow for enhanced electrical and mechanical performance.

In addition to electrically functional materials, processors, amps, logic, ASICS and other integrated active and passive chips can be placed on each or any layer as desired. This can be done in a packaged or unpackaged form. The unpackaged form is bare die. Micro-dispensing on all active devices and including bare die for electrical connection is important for complete circuit builds. These packaged and unpackaged die can be placed using a variety of integrated pick and place techniques.

A common platform may have the capability to micro-dispense curable polymer for structural building, heat, UV, laser, micro-dispense electrically functional materials, place packaged and unpackaged die, with cameras and sensor for feedback and operate any or all of these operations under one common software platform. The number of each separate capability can vary and be numerous thus providing parallel processing for increased speed.

FIG. 1 illustrates one embodiment of a system 10 which may be used for manufacturing 3D objects. The system 10 includes a control system 12. The control system 12 provides for controlling a plurality of nozzles 14 of syringe-based micro-dispensing tools. A number of nozzles 14 can be placed on one platform, allowing for parallel printing of each layer, thus allowing for a significant increase in the speed of building 3D objects. These nozzles 14 can be placed in columns and rows allowing for a single pass or multiple passes to fabricate a pattern. Each nozzle 14 may have the ability to turn material flow on or off thus allowing dots, dashes and/or lines to be printed. The combination of dots, dashes and lines can produce any 2D or conformal pattern. After curing or partial curing, a second layer of patterning and curing, and the process may be repeated until the final 3D build is complete.

Multiple removal tools 16 are also shown. The removal tools may include one or more pulsed lasers. One or more curing sources 18 are also shown. The curing sources 18 may include curing sources for photo curing, thermal curing, electrical curing, inductive curing, or chemically induced curing. In addition, tools for performing pick and place functions 20 are also shown which may be used for placing packaged or unpackaged dies. One or more cameras 22 may be used for acquiring imagery which may be analyzed and used by the control system 12 to adjust the manufacturing process in real-time or otherwise. Various sensors 24 may also be used such as heat sensors and/or light sensors to assist in monitoring the manufacturing process of building the layers of the 3D object 26.

Figure 2:
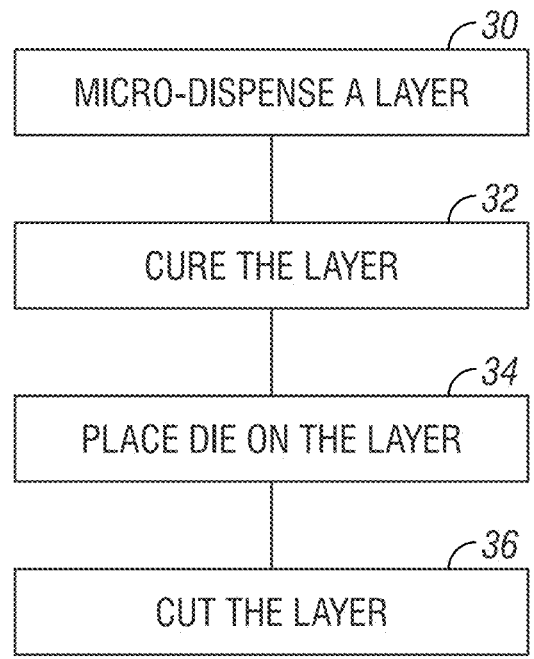
FIG. 2 illustrates one embodiment of a method.

FIG. 2 illustrates one example of a method of the present invention. In step 30 a layer is micro-dispensed with a syringe-based dispensing tool. In step 32, the layer is cured. Steps 30 and 32 may then repeat to build an object from a plurality of different layers. It is to be understood that the step of curing may occur in real-time so that there is no delay between dispensing of different layers. In addition, in optional step 34 a die (packaged or unpackaged) may be placed on the layer or in step 36 cutting of the layer may occur.

In addition, as previously explained, the material which is dispensed may be loaded with nano to micron sized particles. The method may further include post processing the three dimensional structure at a sufficiently high temperature to burn off the material and leave the particles for sintering.

Figure 3:
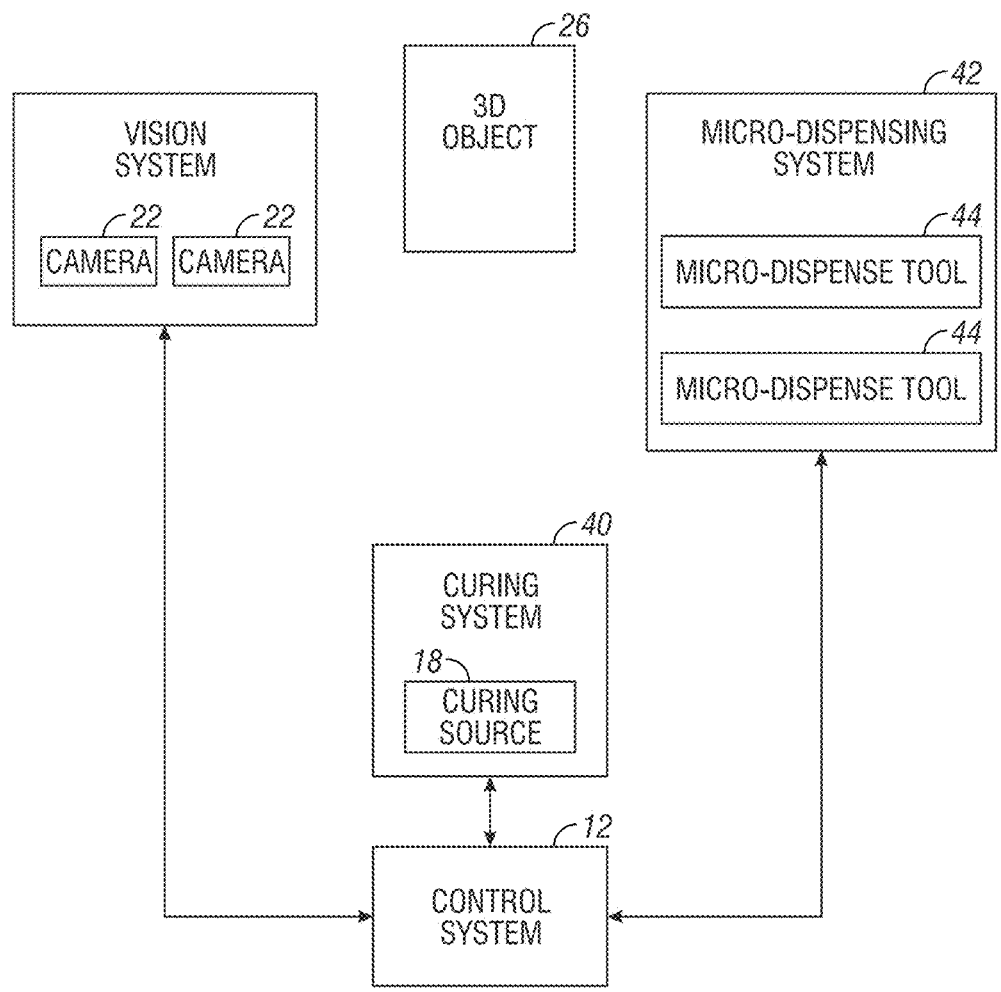
FIG. 3 illustrates another embodiment of the system.

FIG. 3 illustrates another embodiment of a system. As shown in FIG. 3, a 3D object 26 is built. A microdispensing system 42 is used which may include one or more microdispensing tools 44 such as the nozzles previously described or a syringe-based dispensing tool as previously described. A curing system 40 is also used which may include a curing source 18. Thus, the microdispensing system 42 may dispense a layer which is cured using the curing system 40, preferably in real-time to build up the 3D object 26. A vision system with one or more cameras 22 may be used to acquire visual imagery which may be used to adjust parameters associated with the manufacturing process as the 3D object 26 is built.

Therefore, methods and systems have been disclosed for manufacturing three dimensional objects. The present invention contemplates numerous variations, options, and alternatives.

What is claimed is:

1. A method of building a solid three dimensional (3D) structure from a material comprising a polymer, the method comprising:
    (a) micro-dispensing a polymer layer comprising the material onto a surface using a syringe-based micro-dispensing tool;
    (b) after micro-dispensing the polymer layer onto the surface, curing the polymer layer, wherein the curing is performed by a plurality of laser or ultra-violet (UV) sources in parallel or series to increase speed of building the three-dimensional structure; and
    (c) repeating steps (a) and (b) a plurality of times to build the solid three-dimensional structure from successive layers of the material overlaying previous layers, with each of the previous layers serving as the surface for a next of the successive layers.

2. The method of claim 1 wherein the material is loaded with at least one of nano to micron sized particles, tubes, or strings.

3. The method of claim 1 wherein the material is loaded with nano to micron sized particles, the method further comprising post processing the three dimensional structure at a sufficiently high temperature to burn off the material and leave the particles.

4. The method of claim 1 wherein the layer comprises a partial or complete circuit.

5. The method of claim 1 further comprising placing a packaged or unpackaged die on the layer.

6. The method of claim 1 wherein the syringe-based micro-dispending tool comprises a plurality of nozzle operating independently and adapted for use in parallel or in series to increase speed of building the three-dimensional structure.

7. The method of claim 1 further comprising cutting the layer with one of a plurality of cutting sources used in parallel or series to increase speed of material removal.

8. The method of claim 7 wherein the plurality of cutting sources comprise a plurality of lasers.

9. The method of claim 1 further comprising cutting the layer by splitting a laser to allow for parallel cutting to increase speed of material removal.

10. The method of claim 1 further comprising using feedback from cameras and vision to increase speed and accuracy in building the three dimensional structure.

11. The method of claim 1 further comprising observing steps (a) and (b) using one or more cameras.

12. The method of claim 1 further comprising generating feedback using sensors for heat.

13. The method of claim 12 further comprising using the feedback in providing temperature control over the step of curing or annealing.

14. The method of claim 1 further comprising generating feedback using sensors for light and using the feedback in providing photo sensitive curing control.

15. The method of claim 1 wherein the curing the polymer layer is performed in real-time and wherein the material consists of the polymer and the polymer layer consists of the material.

16. A method of building a solid three dimensional (3D) structure, the method comprising:
    providing a system comprising: (a) a control system, (b) a syringe-based micro-dispensing tool operatively connected to the control system, the syringe-based micro-dispensing tool comprising a plurality of nozzles operating independently and the control system adapted to control the plurality of nozzles in parallel or in series, (c) a curing system for curing layers of the solid 3D structure wherein the curing system provides for laser curing and ultra-violet curing;
    micro-dispensing a first layer comprising a first set of materials using the syringe-based micro-dispensing tool;
    after micro-dispensing the first layer, curing the first layer using the curing system, wherein a plurality of laser or ultra-violet (UV) sources are used to cure a polymer within the first set of materials;
    after the curing of the first layers using the curing system, micro-dispensing a second layer comprising a second set of materials using the syringe-based micro-dispensing tool, the second layer overlaying and in direct contact with the first layer to form successive layers;
    after micro-dispensing the second layer, curing the second layer using the curing system; and after the curing of the second layer using the curing system, micro-dispensing and curing one or more additional layers, the additional layers overlaying the second layer.

17. The method of claim 16 wherein the first set of materials comprises a plurality of materials and wherein each of the plurality of nozzles dispenses a different material within the first set of materials and wherein at least one of the materials within the first set of materials is loaded with at least one of nano to micron sized particles, tubes, or strings.

18. A method of building a solid three dimensional (3D) structure comprising a plurality of different layers, the method comprising:
(a) micro-dispensing a first layer onto a surface using a first nozzle of a micro-dispensing tool to micro-dispense a first material;
(b) curing the first layer, wherein the curing performed by a first curing source selected from a set consisting of a photo curing source, a thermal curing source, an electrical curing source, an inductive curing source, and a chemically induced curing source;
(c) micro-dispensing a second layer using a second nozzle of the micro-dispensing tool to micro-dispense a second material;
(d) curing the second layer, wherein the curing is performed by a second source, the second curing source selected from a set consisting of a photo curing source, a thermal curing source, an electrical curing source, an inductive curing source, and a chemically induced curing source;
(e) repeating at least one of steps (a) and (b) or steps (c) and (d) a plurality of time to build the solid three-dimensional structure from successive layers overlaying previous layers, with each of the previous layers serving as the surface for a next of the successive layers;
wherein the first material is different from the second material;
wherein the first curing source is different from the second curing source.

19. The method of claim 18 wherein the curing the first layer and the curing the second layer is performed in real-time.

* * * * *